(12) United States Patent
Bai

(10) Patent No.: US 11,507,210 B2
(45) Date of Patent: Nov. 22, 2022

(54) TOUCH DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Sihang Bai, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/972,566

(22) PCT Filed: Jun. 23, 2020

(86) PCT No.: PCT/CN2020/097664
§ 371 (c)(1),
(2) Date: Dec. 4, 2020

(87) PCT Pub. No.: WO2021/248557
PCT Pub. Date: Dec. 16, 2021

(65) Prior Publication Data
US 2021/0397282 A1    Dec. 23, 2021

(30) Foreign Application Priority Data
Jun. 11, 2020 (CN) .......................... 202010528398.1

(51) Int. Cl.
  *G06F 3/041* (2006.01)
  *G06F 3/044* (2006.01)
  *H01L 27/32* (2006.01)

(52) U.S. Cl.
  CPC .......... *G06F 3/0412* (2013.01); *G06F 3/0443* (2019.05); *G06F 3/0448* (2019.05); *G06F 3/04164* (2019.05); *H01L 27/323* (2013.01)

(58) Field of Classification Search
  None
  See application file for complete search history.

(56) References Cited

U.S. PATENT DOCUMENTS

2020/0133438 A1* 4/2020 Kim ................. G06F 3/0448
2020/0174526 A1* 6/2020 Jeong ................. G09F 9/301

FOREIGN PATENT DOCUMENTS

CN    106227380 A    12/2016
CN    106371666 A    2/2017
(Continued)

*Primary Examiner* — Brian M Butcher
(74) *Attorney, Agent, or Firm* — PV IP PC; Wei Te Chung; Ude Lu

(57) ABSTRACT

Disclosed are a touch display panel and a display device. The touch display panel includes an array substrate, a light-emitting functional layer, an encapsulating layer and a touch control layer that are sequentially disposed. The touch control layer includes a plurality of touch electrode blocks arranged in an array and further includes a plurality of electrode lines connected to the plurality of touch electrode blocks in one-to-one correspondence. Each touch electrode block is provided with a hollow structure, and each touch electrode blocks is symmetrical at least with respect to a first axis and a second axis that are perpendicular to each other.

12 Claims, 6 Drawing Sheets

(56) References Cited

FOREIGN PATENT DOCUMENTS

| CN | 106887450 A | 6/2017 |
|---|---|---|
| CN | 206489537 U | 9/2017 |
| CN | 108710447 A | 10/2018 |
| CN | 108733269 A | 11/2018 |
| CN | 110321029 A | 10/2019 |

* cited by examiner (1)

TOUCH DISPLAY PANEL AND DISPLAY DEVICE

RELATED APPLICATIONS

This application is a National Phase of PCT Patent Application No. PCT/CN2020/097664 having international filing date of Jun. 23, 2020, which claims the benefit of priority of Chinese Patent Application No. 202010528398.1 filed on Jun. 11, 2020. The contents of the above applications are all incorporated by reference as if fully set forth herein in their entirety.

FIELD OF THE DISCLOSURE

The present application relates to touch display technologies, and more particularly to a touch display panel and a display device.

DESCRIPTION OF RELATED ARTS

Active-matrix organic light emitting diode (AMOLED) has become an outstanding representative of next-generation display technologies for its advantages including light-weight, flexibility, non-friable property, and wearability. In order to make a display panel lighter and thinner and make a lower bezel smaller, the industry is developing a touch control structure (Direct on touch, DOT).

Compared with a plug-in DOT, a structure with an embedded or In-Cell DOT is simpler, and the lower bezel can be made smaller. At present, most of the embedded DOT structures use a mutual-capacitive principle to realize detection of the position of a touch. FIG. 1 is a schematic diagram illustrating touch control electrodes in an exemplary mutual-capacitive touch control layer. The touch control electrodes of the touch control layer 1 include driving electrodes 2 and sensing electrodes 3. The driving electrodes 2 provide driving signals and the sensing electrodes 3 receiving sensing signals. Each of the driving electrodes 2 and the sensing electrodes 3 connects to an electrode line 4 for signal transmission. FIG. 2 is a partially sectional view of an exemplary mutual-capacitive touch control layer. As shown in FIG. 2, the touch control layer 1 includes a first insulating layer 5, a first metal layer 6 disposed on the first insulating layer 5, a second insulating layer 7 covering the first insulating layer 5 and the first metal layer 6, a second metal layer 8 disposed on the second insulating layer 7, and a passivation layer 19 covering the second insulating layer 7 and the second metal layer 8. The second metal layer 8 includes the driving electrodes 2 and the sensing electrodes 3. The first metal layer 6 bridges two adjacent driving electrodes 2 by using via holes disposed in the second insulating layer 7. Also, the passivation layer 9 needs to be provided with via holes corresponding to the electrode lines to realize electrical connection between the electrode lines and a touch control chip on a circuit board. Therefore, the mutual-capacitive touch control layer needs two layers of metal to be able to realize a touch control function. However, four mask processes are needed to manufacture the mutual-capacitive touch control layer. The four mask processes are the processes used to form the first metal layer 6, the second insulating layer 7, the second metal layer 8 and the passivation layer 9, respectively. As can be known, the process used to manufacture the mutual-capacitive touch control layer is complicated and it is not beneficial to improve the yield and save the cost.

Technical Problems

The present application provides a touch display panel and a display device, which utilize the principle of self-capacitive touch control to realize a touch control function with high sensitivity, and can also save two manufacturing processes, greatly simplify the manufacturing processes, and facilitate saving the cost and improving the yield.

Technical Solutions

In a first aspect, the present application provides a touch display panel, including an array substrate, and a light-emitting functional layer, an encapsulating layer and a touch control layer that are sequentially disposed on the array substrate;

the light-emitting functional layer including a plurality of light-emitting units arranged in an array, wherein gap areas are formed between the plurality of light-emitting units, and the touch control layer includes a plurality of touch electrode blocks arranged in an array and further includes a plurality of electrode lines connected to the plurality of touch electrode blocks in one-to-one correspondence;

the plurality of touch electrode blocks and the plurality of electrode lines located in the gap areas, wherein each of the touch electrode blocks is provided with a hollow structure, and each of the touch electrode blocks is symmetrical at least with respect to a first axis and a second axis that are perpendicular to each other.

In the touch display panel provided in the present application, the hollow structure includes two sub hollow structures located opposite to each other, the two sub hollow structures are symmetrical with respect to the first axis, and each of the sub hollow structures is symmetrical with respect to the second axis.

In the touch display panel provided in the present application, each of the touch electrode blocks includes two edges located opposite to each other, the two sub hollow structures and the two edges are arranged in one-to-one correspondence, each of the sub hollow structures includes a plurality of first sub hollow units arranged at intervals along a corresponding one of the edges, and each of the first sub hollow units is shaped as an isosceles triangle or an isosceles trapezoid such that the touch control electrode has a fishbone shape.

In the touch display panel provided in the present application, each of the touch electrode blocks is rectangular, each of the sub hollow structures has a side close to a corresponding edge of the touch electrode block, the side and the edge are arranged in parallel, and each of the sub hollow structures includes a winding and folding slit.

In the touch display panel provided in the present application, each of the touch electrode blocks is rectangular, each of the sub hollow structures includes two second sub hollow units that are located on two diagonals of a corresponding touch electrode block, respectively, and are disposed close to a same side of the corresponding touch electrode block, and one end of each of the second sub hollow units extends from a center of the corresponding touch electrode block to a corner or an edge of the touch electrode block.

In the touch display panel provided in the present application, each of the sub hollow units is shaped as a straight line, a stair or a wave.

In the touch display panel provided in the present application, the plurality of touch electrode blocks are arranged alongside in multiple columns, and at least one of the electrode lines is provided between any two adjacent columns of the touch electrode blocks.

In the touch display panel provided in the present application, a material of the touch electrode blocks and the electrode lines includes titanium-aluminum alloy or indium tin oxide.

In the touch display panel provided in the present application, the touch control layer further includes an insulating layer and a passivation layer, the insulating layer is located on the encapsulating layer, the plurality of touch electrode blocks and the plurality of electrode lines are located at a side of the insulating layer away from the encapsulating layer, and the passivation layer covers the insulating layer, the plurality of touch electrode blocks and the plurality of electrode lines.

In the touch display panel provided in the present application, the touch display panel further includes a substrate, a polarizer and a protective cover plate, the substrate is disposed at a side of the array substrate away from the light-emitting functional layer, the polarizer is disposed at a side of the touch control layer away from the encapsulating layer, and the protective cover plate is disposed at a side of the polarizer away from the touch control layer.

In a second aspect, the present application further provides a display device, including a touch display panel and a control circuit board electrically connected to the touch display panel;

the touch display panel including an array substrate, and a light-emitting functional layer, an encapsulating layer and a touch control layer that are sequentially disposed on the array substrate;

the light-emitting functional layer including a plurality of light-emitting units arranged in an array, wherein gap areas are formed between the plurality of light-emitting units, and the touch control layer includes a plurality of touch electrode blocks arranged in an array and further includes a plurality of electrode lines connected to the plurality of touch electrode blocks in one-to-one correspondence;

the plurality of touch electrode blocks and the plurality of electrode lines located in the gap areas, wherein each of the touch electrode blocks is provided with a hollow structure, and each of the touch electrode blocks is symmetrical at least with respect to a first axis and a second axis that are perpendicular to each other.

In the display device provided in the present application, the control circuit board is disposed at a rear side of the touch display panel, the control circuit board includes a touch control chip electrically connected to one end of the plurality of electrode lines away from the touch electrode blocks, configured to determine a touch coordinate by detecting a change of capacitance of each of the touch electrode blocks.

In the display device provided in the present application, the hollow structure includes two sub hollow structures located opposite to each other, the two sub hollow structures are symmetrical with respect to the first axis, and each of the sub hollow structures is symmetrical with respect to the second axis.

In the display device provided in the present application, each of the touch electrode blocks includes two edges located opposite to each other, the two sub hollow structures and the two edges are arranged in one-to-one correspondence, each of the sub hollow structures includes a plurality of first sub hollow units arranged at intervals along a corresponding one of the edges, and each of the first sub hollow units is shaped as an isosceles triangle or an isosceles trapezoid such that the touch control electrode has a fishbone shape.

In the display device provided in the present application, each of the touch electrode blocks is rectangular, each of the sub hollow structures has a side close to a corresponding edge of the touch electrode block, the side and the edge are arranged in parallel, and each of the sub hollow structures includes a winding and folding slit.

In the display device provided in the present application, each of the touch electrode blocks is rectangular, each of the sub hollow structures includes two second sub hollow units that are located on two diagonals of a corresponding touch electrode block, respectively, and are disposed close to a same side of the corresponding touch electrode block, and one end of each of the second sub hollow units extends from a center of the corresponding touch electrode block to a corner or an edge of the touch electrode block.

In the display device provided in the present application, each of the sub hollow units is shaped as a straight line, a stair or a wave.

In the display device provided in the present application, the plurality of touch electrode blocks are arranged alongside in multiple columns, and at least one of the electrode lines is provided between any two adjacent columns of the touch electrode blocks.

In the display device provided in the present application, a material of the touch electrode blocks and the electrode lines includes titanium-aluminum alloy or indium tin oxide.

In the display device provided in the present application, the touch control layer further includes an insulating layer and a passivation layer, the insulating layer is located on the encapsulating layer, the plurality of touch electrode blocks and the plurality of electrode lines are located at a side of the insulating layer away from the encapsulating layer, and the passivation layer covers the insulating layer, the plurality of touch electrode blocks and the plurality of electrode lines.

Beneficial Effects

Compared to the existing arts, the touch display panel and the display device provided in the present application utilize the principle of self-capacitive touch control, that is, sensing the capacitance between a finger and the touch electrode blocks to cause an overall change of capacitance of the touch electrode blocks to realize a touch control function. In such a way, only a layer of metal is needed for the touch control layer to realize signal input and signal output. That is, the touch electrode blocks and the electrode lines connected to the touch electrode blocks are formed using a same metal layer. It can simplify manufacturing processes and it is beneficial to save the cost and improve the yield. Also, each touch electrode block is provided with the hollow structure and each touch electrode block is symmetrical at least with respect to the first axis and the second axis. It is beneficial to improve touch sensitivity.

DESCRIPTION OF DRAWINGS

The technical solutions and other beneficial effects of the present application will be more apparent with reference to the detailed descriptions of the embodiments of the present application below in accompanying with the drawings.

DESCRIPTION OF EMBODIMENTS OF THE DISCLOSURE

Figure 1:
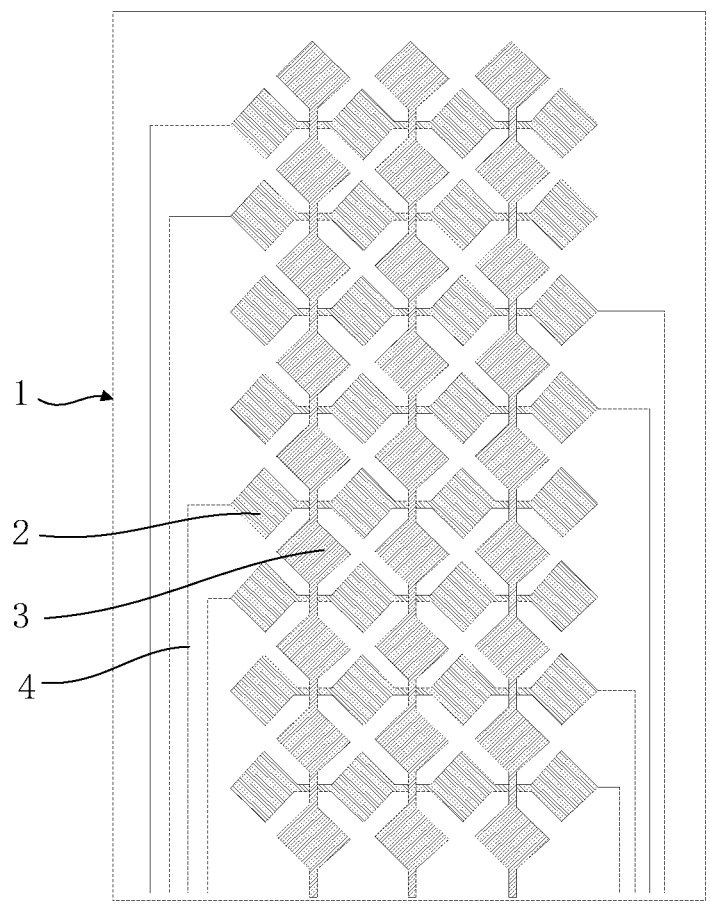
FIG. 1 is a schematic diagram illustrating touch control electrodes in an exemplary mutual-capacitive touch control layer.
Figure 2:
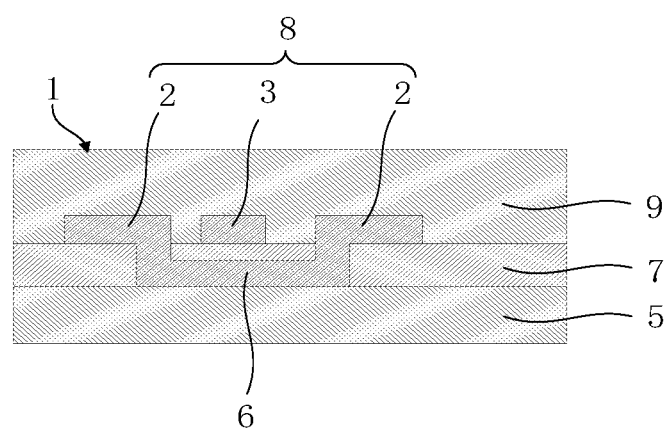
FIG. 2 is a partially sectional view of an exemplary mutual-capacitive touch control layer.

The technical solutions in the embodiments of the present application will be clearly and completely described below with reference to appended drawings of the embodiments of the present application. Obviously, the described embodiments are merely a part of embodiments of the present application and are not all of the embodiments. Based on the embodiments of the present application, all the other embodiments obtained by those of ordinary skill in the art without making any inventive effort are within the scope the present application.

In the description of the present application, it is to be understood that the terms "center", "longitudinal", "lateral", "length", "width", "thickness", "upper", "lower", "front", "rear", "left", "right", "vertical", "horizontal", "top", "bottom", "inner", "outer", "clockwise", "counterclockwise" and the like indicated orientation or positional relationship are based on the relationship of the position or orientation shown in the drawings, which is only for the purpose of facilitating description of the present application and simplifying the description, but is not intended to or implied that the device or element referred to must have a specific orientation, and be constructed and operated in a particular orientation. Therefore, it should not be construed as a limitation of the present application. In addition, the terms "first" and "second" are used for descriptive purposes only, and should not be taken to indicate or imply relative importance, or implicitly indicate the indicated number of technical features. Thus, by defining a feature with "first" or "second", it may explicitly or implicitly include one or more features. In the description of the present application, "a plurality" means two or more unless explicitly defined.

In the description of the present application, it should be noted that unless otherwise explicitly specified or limited, the terms "installed", "connected", and "connection" should be construed broadly, for example, a fixed connection, a removable connection, or integrally connected. These terms may be directed to a mechanical connection, and may also be directed to an electrical connection or communication. Moreover, these terms can be directed to "directly attached", "indirectly connected" through an intermediate medium, and may be directed to "internally communicated" with two components or the "interaction relationship" between two components. For persons skilled in the art, they can understand the specific meaning of the terms in the present application based on specific conditions.

In the present application, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

The following disclosure provides a plurality of different embodiments or examples to implement different structures of this application. To simplify the disclosure of this application, the following describes components and settings in particular examples. Certainly, the examples are merely for illustrative purposes, and are not intended to limit this application. In addition, in this application, reference numerals and/or reference letters may be repeated in different examples. This repetition is for the purpose of simplicity and clarity, and does not in itself indicate a relationship between the various embodiments and/or settings that are discussed. In addition, this application provides examples of various particular processes and materials, but a person of ordinary skill in the art will recognize that other processes and/or materials may be applied and/or used.

Figure 3:
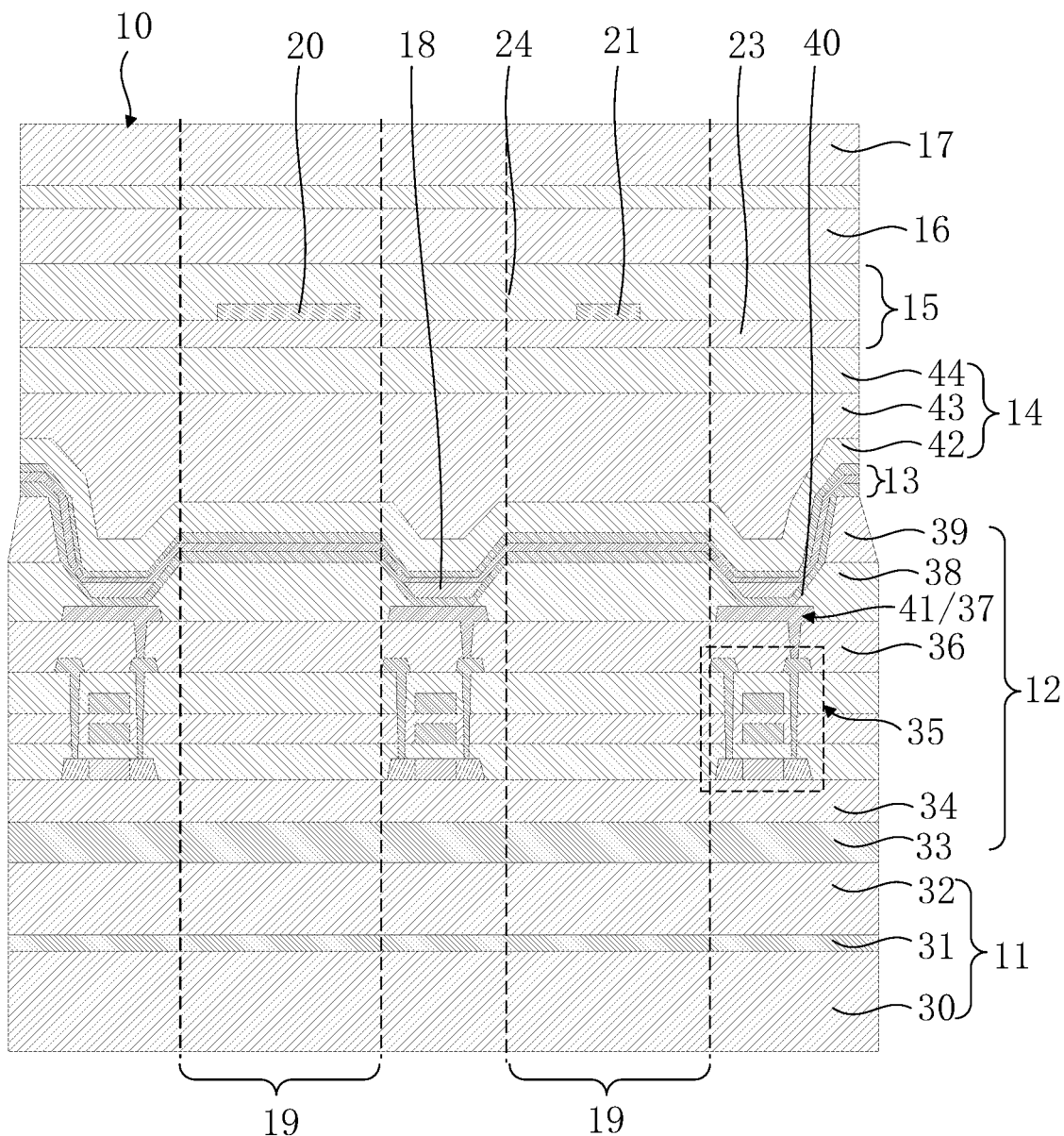
FIG. 3 is a partially sectional view of a touch display panel provided in an embodiment of the present application.
Figure 4:
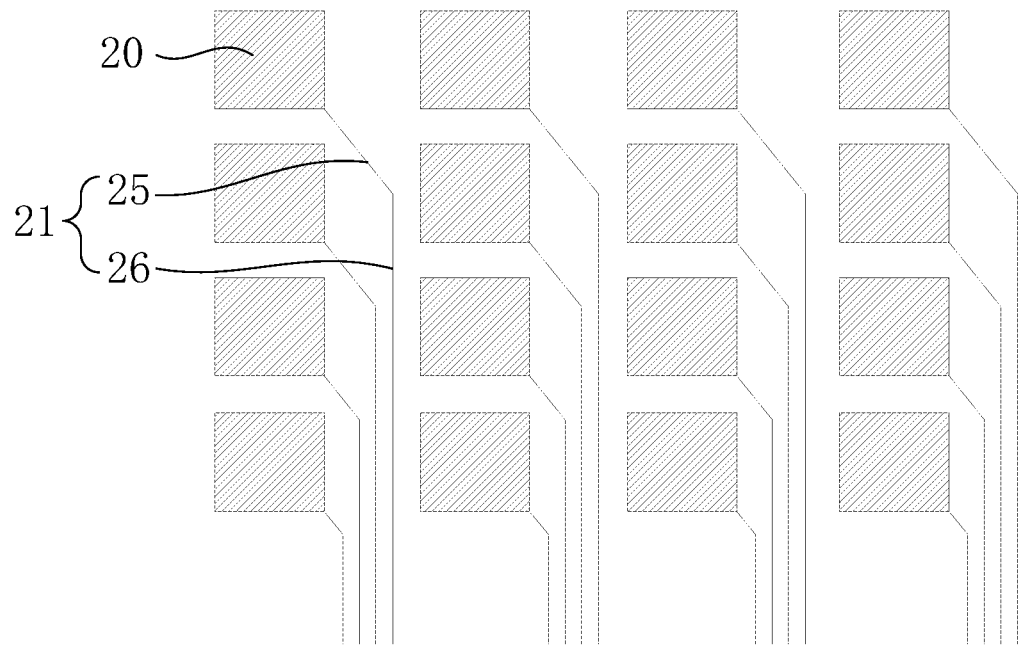
FIG. 4 is a top view of touch electrode blocks and electrode lines provided in an embodiment of the present application.
Figure 5:
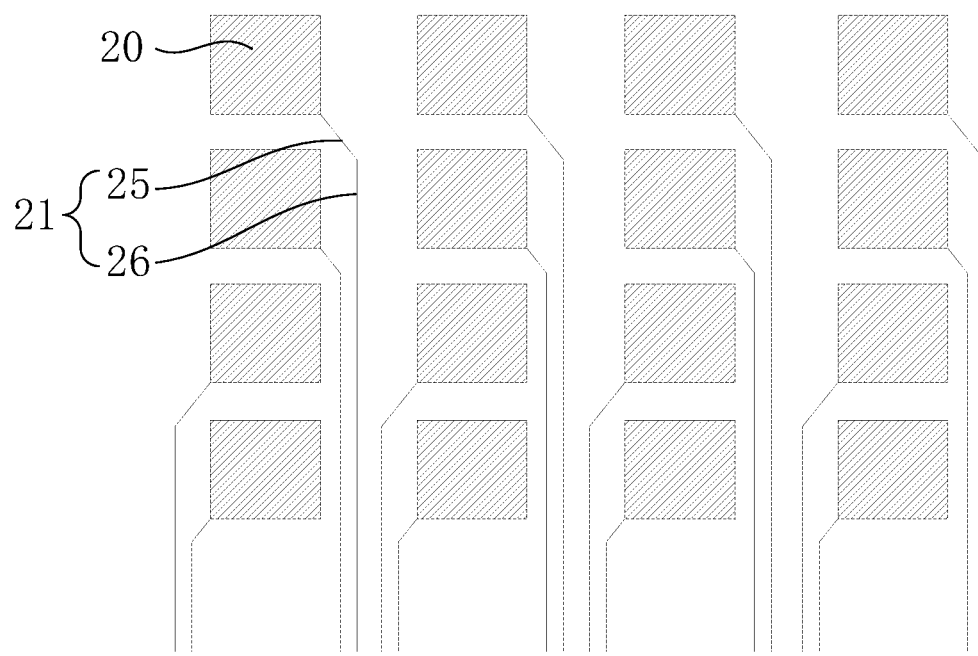
FIG. 5 is a top view of another type of touch electrode blocks and electrode lines provided in an embodiment of the present application.
Figure 6:
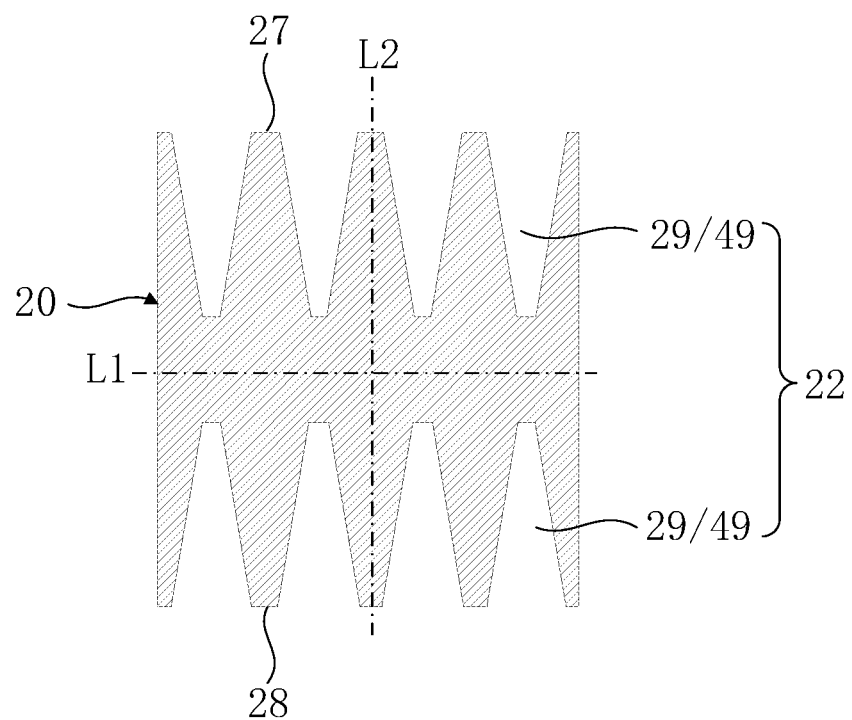
FIG. 6 is a top view of a touch electrode block provided in an embodiment of the present application.

Referring to FIGS. 3 to 6, an embodiment of the present application provides a touch display panel 10. As shown in FIG. 3, the touch display panel 10 includes a substrate 11, and an array substrate 12, a light-emitting functional layer 13, an encapsulating layer 14, a touch control layer 15, a polarizer 16 and a protective cover plate 17 that are sequentially disposed on the substrate 11. The light-emitting functional layer 13 includes a plurality of light-emitting units 18 arranged in an array, and gap areas 19 are formed between the plurality of light-emitting units 18. The touch control layer 15 includes a plurality of touch electrode blocks 20 arranged in an array and further includes a plurality of electrode lines 21 connected to the plurality of touch electrode blocks 20 in one-to-one correspondence. The plurality of touch electrode blocks 20 and the plurality of electrode lines 21 are located in the gap areas 19. As shown in FIG. 6, each touch electrode block 20 is provided with a hollow structure 22, and each touch electrode block 20 is symmetrical at least with respect to a first axis L1 and a second axis L2 that are perpendicular to each other.

Specifically, each touch electrode block 20 is electrically connected to a touch control chip on a control circuit board via a corresponding electrode line 21. When a finger touches the protective cover plate 17 of the touch display panel 10, it will cause a fluctuation of capacitance of the touch electrode block 20 at a position of the touch. The touch control chip is configured to determine a touch coordinate by detecting a change of capacitance of each touch electrode block 20. In the present embodiment, the electrode lines 21 are used for signal input and also for signal output. In this way, the number of signal lines can be reduced so as to simplify the structure of the touch control layer 15.

Specifically, a material of the touch electrode blocks 20 and the electrode lines 21 includes titanium-aluminum alloy (Ti/Al/Ti) or indium tin oxide (ITO).

Specifically, as shown in FIG. 3, the touch control layer 15 further includes an insulating layer 23 and a passivation layer 24. The insulating layer 23 is located on the encapsulating layer 14. The plurality of touch electrode blocks 20 and the plurality of electrode lines 21 are located at a side of the insulating layer 23 away from the encapsulating layer 14. The passivation layer 24 covers the insulating layer 23, the plurality of touch electrode blocks 20 and the plurality of electrode lines 21. Generally, the passivation layer may be provided with via holes at one end of the electrode lines away from the touch electrode blocks, and electrical connection between the electrode lines and the touch control chip is realized by using the via holes. Of course, the passivation layer may also be provided with via holes arranged corresponding to signal lines on the array substrate so as to realize electrical connection between the signal lines and the control circuit board.

Specifically, in manufacturing the touch control layer, the plurality of touch electrode blocks and the plurality of electrode lines are located at a same layer and may be formed by using a same mask process (Mask1). The via holes in the passivation layer may be formed by using another mask process (Mask2). Therefore, only two mask processes are needed to manufacture the touch control layer 15 of the present embodiment. The manufacturing process is simple and it is beneficial to save the cost and improve the yield.

Specifically, as shown in FIGS. 4 and 5, the plurality of touch electrode blocks 20 are arranged alongside in multiple columns, and at least one electrode line 21 is provided between any two adjacent columns of the touch electrode blocks 20. It avoids a touch sensing effect from being affected by dummy areas, unable to sense a touch, formed between two adjacent columns of the touch electrode blocks, resulted by a manner that the electrode lines 21 are not provided between two adjacent columns of the touch electrode blocks 20.

Specifically, each electrode line 21 includes a first sub electrode line 25 and a second sub electrode line 26. One end of the first sub electrode line 25 is connected to a corresponding touch electrode block 20 and the other end of the first sub electrode line 25 is connected to one end of a corresponding second sub electrode line 26. The other end of the second sub electrode line 26 is connected to the touch control chip. Each second sub electrode line 26 is parallel to a direction along which each column of the touch electrode blocks 20 is arranged.

Specifically, the plurality of electrode lines 21 electrically connected to each column of the touch electrode blocks 20 may be located at a same side of a corresponding column of the touch electrode blocks 20 (as shown in FIG. 4), and may be located at two sides of a corresponding column of the touch electrode blocks 20 (as shown in FIG. 5).

Specifically, as show in FIG. 6, the hollow structure 22 includes two sub hollow structures 49 located opposite to each other. The two sub hollow structures 49 are symmetrical with respect to the first axis L1, and each of the sub hollow structures 49 is symmetrical with respect to the second axis L2. Each touch electrode block 20 is provided with two edges located opposite to each other, for example a first edge 27 and a second edge 28 that are located opposite to each other. The two sub hollow structures 49 are arranged in one-to-one correspondence with the first edge 27 and the second edge 28. Each sub hollow structure 49 includes a plurality of first sub hollow units 29 arranged at intervals along a corresponding edge. Each first sub hollow unit 29 is shaped as an isosceles triangle or an isosceles trapezoid such that the touch control electrode has a fishbone shape. That is to say, the hollow structure 22 makes the two opposite edges of the touch control electrode symmetrically form a plurality of protrusions at intervals. It is beneficial to improve sensitivity of a change of capacitance of the touch electrode block 20, thereby improving the sensitivity of detection of a position of the touch and improving touch sensitivity (response speed) of the touch display panel 10.

Specifically, as shown in FIG. 3, the substrate 11 includes a first organic layer 30, an inorganic layer 31 and a second organic layer 32. A material of the first organic layer 30 and the second organic layer 32 includes polyimide (PI).

Specifically, as shown in FIG. 3, the array substrate 12 includes a water and oxygen blocking layer 33, a buffer layer 34, an array 35 of thin-film transistors, a flattening layer 36, an anode layer 37, a pixel definition layer 38 and a supporting layer 39 that are sequentially disposed on the second organic layer 32 of the substrate 11. The array 35 of thin-film transistors includes a plurality of thin-film transistors arranged in an array. Each thin-film transistor includes a semiconductor unit disposed on the buffer layer, a first gate insulating layer covering the buffer layer 34 and the semiconductor unit, a first gate disposed on the first insulating layer and disposed corresponding to the semiconductor unit, a second gate insulating layer covering the first gate insulating layer and the first gate, a second gate disposed on the second gate insulating layer and disposed corresponding to the first gate, an insulating interlayer covering the second gate insulating layer and the second gate, and a source and a drain disposed on the insulating interlayer and disposed corresponding to two ends of the semiconductor unit, respectively. Also, by use of a first contact hole and a second contact hole that penetrate the insulating interlayer, the second gate insulating layer and the first gate insulating layer, the source and the drain are connected to the two ends of the semiconductor unit, respectively. All the first gate insulating layer, the second gate insulating layer and the insulating interlayer of the plurality of thin-film transistors are individually arranged as a whole.

Specifically, ohm contact units may be provided at two ends of the semiconductor unit. By use of a first contact hole and a second contact hole, the source and the drain are connected to the ohm contact units at the two ends of the semiconductor unit, respectively.

It should be noted that the thin-film transistor may also be a structure with a single gate, and the present application is not limited to a specific structure of the thin-film transistor.

Specifically, as shown in FIG. 3, the anode layer 37 includes a plurality of anode units 41 disposed corresponding to a plurality of light-emitting units 18 in one-to-one correspondence. The plurality of anode units 41 are electrically connected to the plurality of thin-film transistors in one-to-one correspondence. Each anode unit 41 is electrically connected to the drain of a corresponding thin-film transistor via a via hole disposed in the flattening layer 36.

Specifically, a plurality of pixel openings 40 are provided on the pixel definition layer 38 and are provided corresponding to the plurality of anode units 41. The light-emitting functional layer 13 is connected to the anode units 41 via the pixel openings 40. The light-emitting functional layer 13 further includes a hole injection layer, a hole transmission layer, an electron transmission layer, an electron injection layer and a cathode layer that extend to the pixel definition layer 38 and the supporting layer 39. The light-emitting units 18 are located between the hole transmission layer and the electron transmission layer, and are disposed only within the pixel openings 40. That is to say, the gap areas can be the areas located between the plurality of pixel openings 40, and can also be construed as non-light-emitting areas.

Specifically, as shown in FIG. 3, the encapsulating layer 14 includes thin-film encapsulating layers. That is to say, the encapsulating layer 14 includes a first inorganic encapsulating layer 42, an organic encapsulating layer 43 and a second inorganic encapsulating layer 44 that are sequentially disposed on the light-emitting functional layer 13.

Specifically, as shown in FIG. 3, the protective cover plate 17 includes a glass cover, and the protective cover plate 17 is adhered to the polarizer 16 using optical adhesive.

In the present embodiment, the touch display panel 10 utilizes the principle of self-capacitive touch control, that is, sensing the capacitance between a finger and the touch electrode blocks 20 to cause an overall change of capacitance of the touch electrode blocks 20 to realize a touch control function. In such a way, only a layer of metal is needed for the touch control layer 15 to realize signal input and signal output. That is, the touch electrode blocks 20 and the electrode lines connected to the touch electrode blocks 20 are formed using a same metal layer. It can simplify manufacturing processes and it is beneficial to save the cost and improve the yield. Also, each touch electrode block 20 is provided with the hollow structure 22 and each touch electrode block 20 is symmetrical at least with respect to the first axis L1 and the second axis L2. It is beneficial to improve touch sensitivity of the touch display panel 10.

Figure 7:
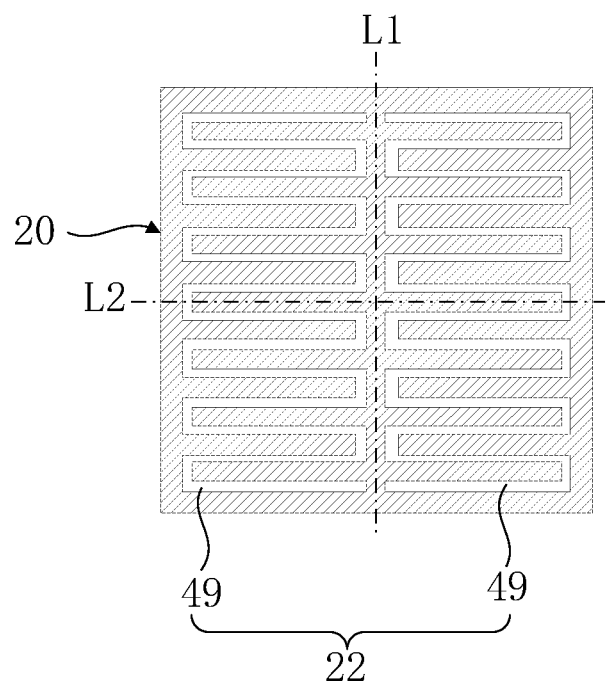
FIG. 7 is a top view of another touch electrode block provided in an embodiment of the present application.

As shown in FIG. 7, an embodiment of the present application further provides a touch display panel 10. Different from above embodiments, this embodiment is provided that each touch electrode block 20 is rectangular. Each sub hollow structure 49 has a side close to a corresponding edge of the touch electrode block 20, and the side and the edge are arranged in parallel. Each sub hollow structures 49 includes a winding and folding slit. The winding and folding slit makes an inner part of the touch control electrode 20 symmetrically form a plurality of protrusions at intervals. It is beneficial to improve sensitivity of a change of capacitance of the touch electrode block 20, thereby improving the sensitivity of detection of a position of the touch and improving touch sensitivity (response speed) of the touch display panel 10.

In the present embodiment, the touch display panel 10 utilizes the principle of self-capacitive touch control, that is, sensing the capacitance between a finger and the touch electrode blocks 20 to cause an overall change of capacitance of the touch electrode blocks 20 to realize a touch control function. In such a way, only a layer of metal is needed for the touch control layer 15 to realize signal input and signal output. That is, the touch electrode blocks 20 and the electrode lines connected to the touch electrode blocks 20 are formed using a same metal layer. It can simplify manufacturing processes and it is beneficial to save the cost and improve the yield. Also, each touch electrode block 20 is provided with the hollow structure 22 and each touch electrode block 20 is symmetrical at least with respect to the first axis L1 and the second axis L2. It is beneficial to improve touch sensitivity of the touch display panel 10.

Figure 8:
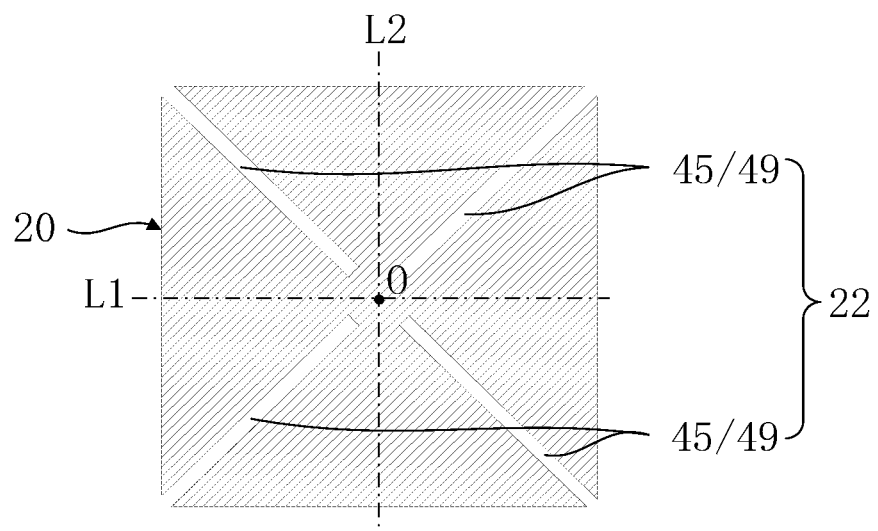
FIG. 8 is a top view of another touch electrode block provided in an embodiment of the present application.
Figure 9:
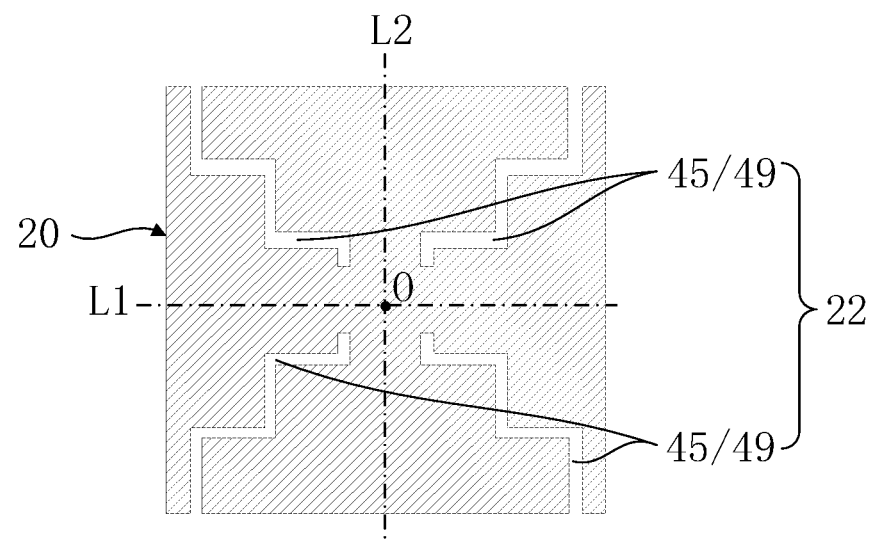
FIG. 9 is a top view of another touch electrode block provided in an embodiment of the present application.

As shown in FIGS. 8 and 9, an embodiment of the present application further provides a touch display panel 10. Different from above embodiments, this embodiment is provided that each touch electrode block 20 is rectangular. Each sub hollow structure 49 includes two second sub hollow units 45 that are located on two diagonals of a corresponding touch electrode block 20, respectively, and are disposed close to a same side of the corresponding touch electrode block 20. One end of each second sub hollow unit 45 extends from a central point O of the corresponding touch electrode block 20 to a corner or an edge of the touch electrode block 20.

Specifically, each sub hollow unit 45 is shaped as a straight line, a stair or a wave.

Specifically, four second sub hollow units 45 of each touch electrode block 20 make the touch control electrode 20 have protrusions extending along four different directions. It is beneficial to improve sensitivity of a change of capacitance of the touch electrode block 20, thereby improving the sensitivity of detection of a position of the touch and improving touch sensitivity (response speed) of the touch display panel 10.

Specifically, the central point O is the intersection of the first axis L1 and the second axis L2.

In the present embodiment, the touch display panel 10 utilizes the principle of self-capacitive touch control, that is, sensing the capacitance between a finger and the touch electrode blocks 20 to cause an overall change of capacitance of the touch electrode blocks 20 to realize a touch control function. In such a way, only a layer of metal is needed for the touch control layer 15 to realize signal input and signal output. That is, the touch electrode blocks 20 and the electrode lines connected to the touch electrode blocks 20 are formed using a same metal layer. It can simplify manufacturing processes and it is beneficial to save the cost and improve the yield. Also, each touch electrode block 20 is provided with the hollow structure 22 and each touch electrode block 20 is symmetrical at least with respect to the first axis L1 and the second axis L2. It is beneficial to improve touch sensitivity of the touch display panel 10.

Figure 10:
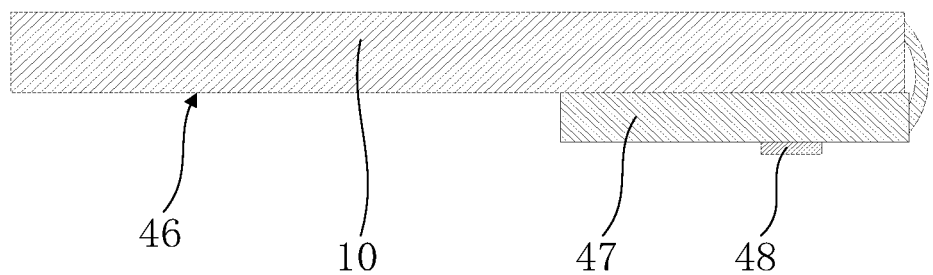
FIG. 10 is a partial sectional view of a display device provided in an embodiment of the present application.

As shown in FIG. 10 an embodiment of the present application further provides a display device 46. The display device 46 includes any touch display panel 10 of the afore-described embodiments, and a control circuit board 47 electrically connected to the touch display panel 10.

Specifically, the control circuit board 47 is disposed at a rear side of the touch display panel 10. The control circuit board 47 includes a touch control chip 48 electrically connected to one end of the plurality of electrode lines away from the touch electrode blocks, and is configured to determine a touch coordinate by detecting a change of capacitance of each of the touch electrode blocks.

In the present embodiment, the touch display panel 10 utilizes the principle of self-capacitive touch control, that is, sensing the capacitance between a finger and the touch electrode blocks 20 to cause an overall change of capacitance of the touch electrode blocks 20 and using the touch control chip 48 to detect a change of capacitance of each touch electrode block to determine a position of the touch such that a touch control function is realized. In such a way, only a layer of metal is needed for the touch control layer to realize signal input and signal output. That is, the touch electrode blocks and the electrode lines connected to the touch electrode blocks are formed using a same metal layer. It can simplify manufacturing processes and it is beneficial to save the cost and improve the yield. Also, each touch electrode block 20 is provided with the hollow structure and each touch electrode block is symmetrical at least with respect to the first axis L1 and the second axis L2. It is beneficial to improve touch sensitivity of the display device 46.

In the above embodiments, different emphasis is placed on respective embodiments, and reference may be made to related depictions in other embodiments for portions not detailed in a certain embodiment.

Hereinbefore, the touch display panel and the display device provided in the embodiments of the present application are introduced in detail, the principles and implementations of the present application are set forth herein with reference to specific examples, descriptions of the above embodiments are merely served to assist in understanding the technical solutions and essential ideas of the present application. Those having ordinary skill in the art should understand that they still can modify technical solutions recited in the aforesaid embodiments or equivalently replace partial technical features therein; these modifications or substitutions do not make essence of corresponding technical solutions depart from the spirit and scope of technical solutions of embodiments of the present application.

The invention claimed is:

1. A touch display panel, comprising an array substrate, and a light-emitting functional layer, an encapsulating layer and a touch control layer that are sequentially disposed on the array substrate;
the light-emitting functional layer comprising a plurality of light-emitting units arranged in an array, wherein gap areas are formed between the plurality of light-emitting units, and the touch control layer comprises a plurality of touch electrode blocks arranged in an array and further comprises a plurality of electrode lines connected to the plurality of touch electrode blocks in one-to-one correspondence;
the plurality of touch electrode blocks and the plurality of electrode lines located in the gap areas, wherein each of the touch electrode blocks is provided with a hollow structure, and each of the touch electrode blocks is symmetrical at least with respect to a first axis and a second axis that are perpendicular to each other,
wherein the hollow structure comprises two sub hollow structures located opposite to each other, the two sub hollow structures are symmetrical with respect to the first axis, and each of the sub hollow structures is symmetrical with respect to the second axis,
wherein each of the touch electrode blocks comprises two edges located opposite to each other, the two sub hollow structures and the two edges are arranged in one-to-one correspondence, each of the sub hollow structures comprises a plurality of first sub hollow units arranged at intervals along a corresponding one of the edges, and each of the first sub hollow units is shaped as an isosceles triangle or an isosceles trapezoid such that the touch control electrode has a fishbone shape.

2. The touch display panel according to claim 1, wherein the plurality of touch electrode blocks are arranged alongside in multiple columns, and at least one of the electrode lines is provided between any two adjacent columns of the touch electrode blocks.

3. The touch display panel according to claim 1, wherein a material of the touch electrode blocks and the electrode lines comprises titanium-aluminum alloy or indium tin oxide.

4. The touch display panel according to claim 1, wherein the touch control layer further comprises an insulating layer and a passivation layer, the insulating layer is located on the encapsulating layer, the plurality of touch electrode blocks and the plurality of electrode lines are located at a side of the insulating layer away from the encapsulating layer, and the passivation layer covers the insulating layer, the plurality of touch electrode blocks and the plurality of electrode lines.

5. The touch display panel according to claim 1, further comprising a substrate, a polarizer and a protective cover plate, the substrate is disposed at a side of the array substrate away from the light-emitting functional layer, the polarizer is disposed at a side of the touch control layer away from the encapsulating layer, and the protective cover plate is disposed at a side of the polarizer away from the touch control layer.

6. A display device, comprising a touch display panel and a control circuit board electrically connected to the touch display panel, the touch display panel, comprising an array substrate, and a light-emitting functional layer, an encapsulating layer and a touch control layer that are sequentially disposed on the array substrate;
the light-emitting functional layer comprising a plurality of light-emitting units arranged in an array, wherein gap areas are formed between the plurality of light-emitting units, and the touch control layer comprises a plurality of touch electrode blocks arranged in an array and further comprises a plurality of electrode lines connected to the plurality of touch electrode blocks in one-to-one correspondence;
the plurality of touch electrode blocks and the plurality of electrode lines located in the gap areas, wherein each of the touch electrode blocks is provided with a hollow structure, and each of the touch electrode blocks is symmetrical at least with respect to a first axis and a second axis that are perpendicular to each other,
wherein the hollow structure comprises two sub hollow structures located opposite to each other, the two sub hollow structures are symmetrical with respect to the first axis, and each of the sub hollow structures is symmetrical with respect to the second axis,
wherein each of the touch electrode blocks is rectangular, each of the sub hollow structures has a side close to a corresponding edge of the touch electrode block, the side and the edge are arranged in parallel, and each of the sub hollow structures comprises a winding and folding slit.

7. The display device according to claim 6, wherein the control circuit board is disposed at a rear side of the touch display panel, the control circuit board comprises a touch control chip electrically connected to one end of the plurality of electrode lines away from the touch electrode blocks, configured to determine a touch coordinate by detecting a change of capacitance of each of the touch electrode blocks.

8. The display device according to claim 6, wherein the plurality of touch electrode blocks are arranged alongside in multiple columns, and at least one of the electrode lines is provided between any two adjacent columns of the touch electrode blocks.

9. The display device according to claim 6, wherein a material of the touch electrode blocks and the electrode lines comprises titanium-aluminum alloy or indium tin oxide.

10. The display device according to claim 6, wherein the touch control layer further comprises an insulating layer and a passivation layer, the insulating layer is located on the encapsulating layer, the plurality of touch electrode blocks and the plurality of electrode lines are located at a side of the insulating layer away from the encapsulating layer, and the passivation layer covers the insulating layer, the plurality of touch electrode blocks and the plurality of electrode lines.

11. A touch display panel, comprising an array substrate, and a light-emitting functional layer, an encapsulating layer and a touch control layer that are sequentially disposed on the array substrate;

the light-emitting functional layer comprising a plurality of light-emitting units arranged in an array, wherein gap areas are formed between the plurality of light-emitting units, and the touch control layer comprises a plurality of touch electrode blocks arranged in an array and further comprises a plurality of electrode lines connected to the plurality of touch electrode blocks in one-to-one correspondence;

the plurality of touch electrode blocks and the plurality of electrode lines located in the gap areas, wherein each of the touch electrode blocks is provided with a hollow structure, and each of the touch electrode blocks is symmetrical at least with respect to a first axis and a second axis that are perpendicular to each other, wherein the hollow structure comprises two sub hollow structures located opposite to each other, the two sub hollow structures are symmetrical with respect to the first axis, and each of the sub hollow structures is symmetrical with respect to the second axis, wherein each of the touch electrode blocks is rectangular, each of the sub hollow structures comprises two second sub hollow units that are located on two diagonals of a corresponding touch electrode block, respectively, and are disposed close to a same side of the corresponding touch electrode block, and one end of each of the second sub hollow units extends from a center of the corresponding touch electrode block to a corner or an edge of the touch electrode block.

12. The touch display panel according to claim 11, wherein each of the sub hollow units is shaped as a straight line, a stair or a wave.

\* \* \* \* \*